(12) United States Patent
Mochzuki et al.

(10) Patent No.: US 6,356,445 B1
(45) Date of Patent: Mar. 12, 2002

(54) HEAT DISSIPATING DEVICE FOR ELECTRONIC DEVICE

(75) Inventors: Masataka Mochzuki, Tokoyo (JP); Chi-Tsung Peng, Chung-Ho; Yung-Chou Chen, Tu-Chen, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/678,359

(22) Filed: Oct. 2, 2000

(30) Foreign Application Priority Data

Oct. 7, 1999 (JP) .......................................... 11-287254

(51) Int. Cl.[7] ................................................. H05K 7/20
(52) U.S. Cl. ....................... 361/697; 361/695; 361/698; 361/700; 361/719; 174/15.2; 174/16.1; 174/16.3; 257/714; 257/715; 165/80.3; 165/80.4
(58) Field of Search ................................ 361/694, 695, 361/697–700, 702, 703, 704, 707, 719; 257/706, 712, 713–715, 718, 719, 721, 722, 727; 174/15.1, 15.2, 16.1, 16.3; 165/80.2, 80.3, 80.4, 185

(56) References Cited

U.S. PATENT DOCUMENTS 4,246,597 A * 1/1981 Cole et al. .................. 257/713
5,296,739 A * 3/1994 Heilbronner et al. ........ 257/687
5,664,624 A * 9/1997 Tsai et al. ................... 165/80.3
5,754,400 A * 5/1998 Sathe et al. .................. 361/704
5,757,621 A * 5/1998 Patel ........................... 361/719
5,880,930 A * 5/1999 Wheaton ..................... 361/690
5,901,039 A * 5/1999 Dehaine et al. ............. 361/704
6,122,169 A * 9/2000 Liu et al. ..................... 361/700
6,151,214 A * 11/2000 Yeh ............................ 361/695
6,212,074 B1 * 4/2001 Gonsalves et al. .......... 361/717

* cited by examiner

*Primary Examiner*—Leo P. Picard
*Assistant Examiner*—Boris L. Chervinsky
(74) *Attorney, Agent, or Firm*—Wei Te Chung

(57) ABSTRACT

A heat dissipating device includes a heat sink (50) for removing heat from an electronic device (90), and a plurality of adjusters (45) for adjusting distance and contact force between the electronic device and the heat sink. The heat sink defines a plurality of receiving holes (62) for receiving respective adjusters, and a plurality of communicating through holes (66) whose diameters are smaller than those of the receiving holes. A shoulder (64) of the heat sink is formed where each receiving hole communicates with each through hole. Each adjuster comprises a connecting shaft (42), a lock screw (46) with a head (464), and a spring (44). The lock screw threadedly engages with the connecting shaft, and the spring is secured between the shoulder of the heat sink and the head.

8 Claims, 4 Drawing Sheets

HEAT DISSIPATING DEVICE FOR ELECTRONIC DEVICE

BACKGROUND OF THE INVENTION

1. Field of The Invention

The present invention relates to a heat dissipating device for an electronic device, and particularly to a heat dissipating device having an adjuster for adjusting distance and contact force between the heat dissipating device and the electronic device.

2. The Related Art

Many electronic devices, such as central processing units (CPUs), operate only within a limited temperature range. They usually become unstable when the operating temperature is outside the range. On the other hand, such electronic devices frequently generate great amounts of heat during operation. To maintain operational temperature within the proper range, a heat dissipating device is often used to remove heat from an electronic device.

A conventional heat dissipating device as disclosed in Japan Patent No. 8-55942 comprises a heat sink contacting with an electronic device which is mounted on a printed circuit board, and a radiating plate which is connected to the heat sink opposite to the print circuit board. The heat dissipating device dissipates heat from the electronic device. However, because of tolerances between the radiating plate, the heat sink and the electronic device, it is difficult to ensure that the distance and contact force between the electronic device and the heat sink are at optimal levels. If the distance between the electronic device and the heat sink is too large, a gap may result therebetween, thereby reducing the efficiency of heat dissipation. If such distance is too small, an excessive force may be created, which may damage the electronic device.

It is strongly desired to provide a heat dissipating device which overcomes the above problems encountered in the prior art.

SUMMARY OF THE INVENTION

Accordingly, an object of the present invention is to provide a heat dissipating device having an adjuster to protect the electronic device from damage.

Another object of the present invention is to provide a heat dissipating device having an adjuster to improve the efficiency of heat dissipation.

To achieve the above-mentioned objects, a heat dissipating device in accordance with the present invention comprises a heat sink for removing heat from an electronic device, and a plurality of adjusters for adjusting distance and force between the electronic device and the heat sink. The heat sink defines a plurality of receiving holes for respectively receiving the adjusters. The heat sink also defines a plurality of through holes axially aligned with and communicating with respective receiving holes. The diameter of each through hole is smaller than that of each receiving hole. Thus a shoulder is formed in an upper portion of the heat sink where each receiving hole communicates with each through hole. The adjuster comprises a connecting shaft, a lock screw with a head threadedly engaging with the connecting shaft, and a spring secured between the shoulder of the heat sink and the head.

Other objects, advantages and novel features of the present invention will be drawn from the following detailed description of a preferred embodiment of the present invention with reference to the attached drawings, in which:

DESCRIPTION OF THE PREFERRED EMBODIMENT

Figure 1:
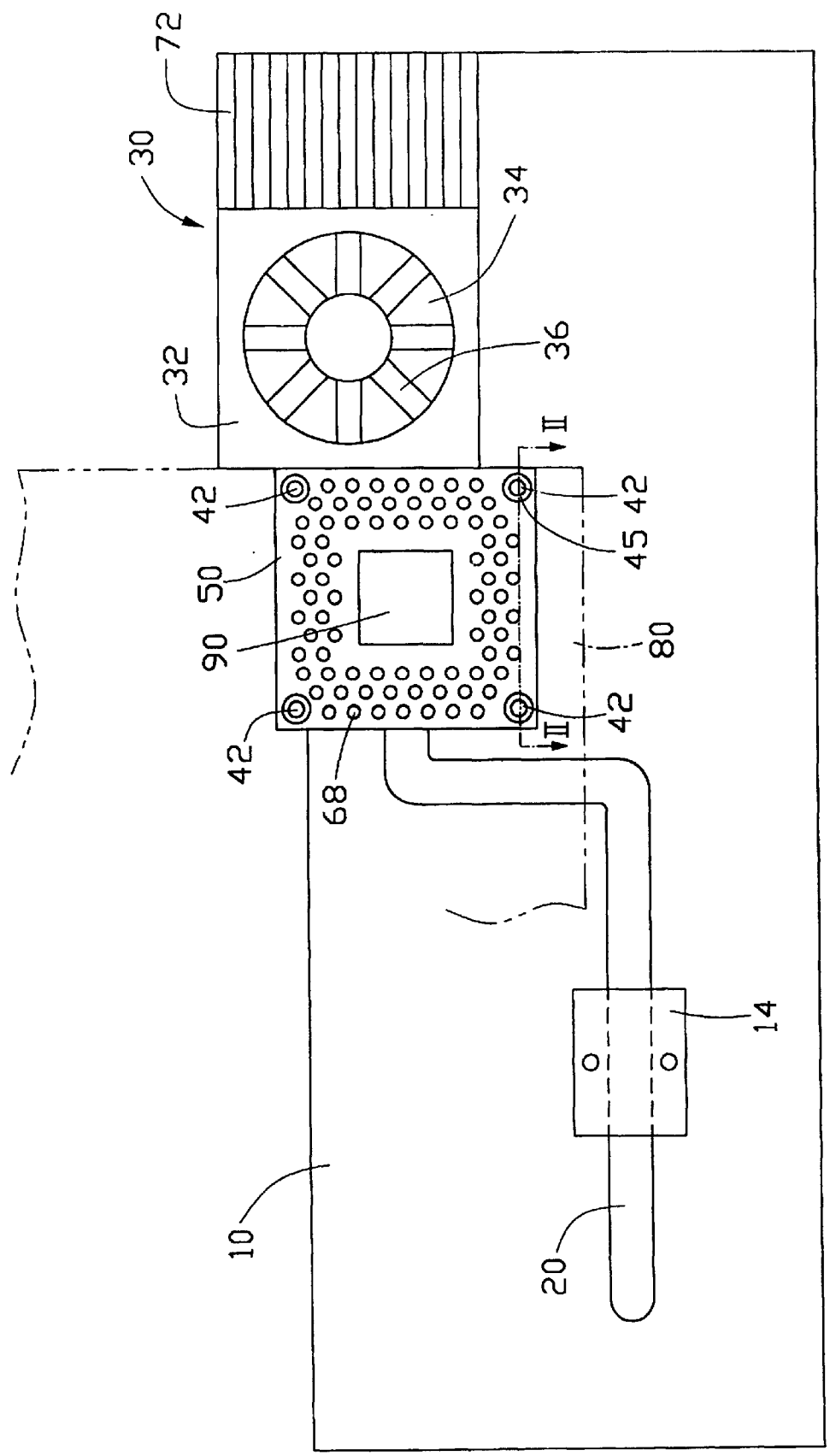
FIG. 1 is a top plan view of a heat dissipating device of the present invention mounted between an electronic device and a radiating plate.
Figure 2:
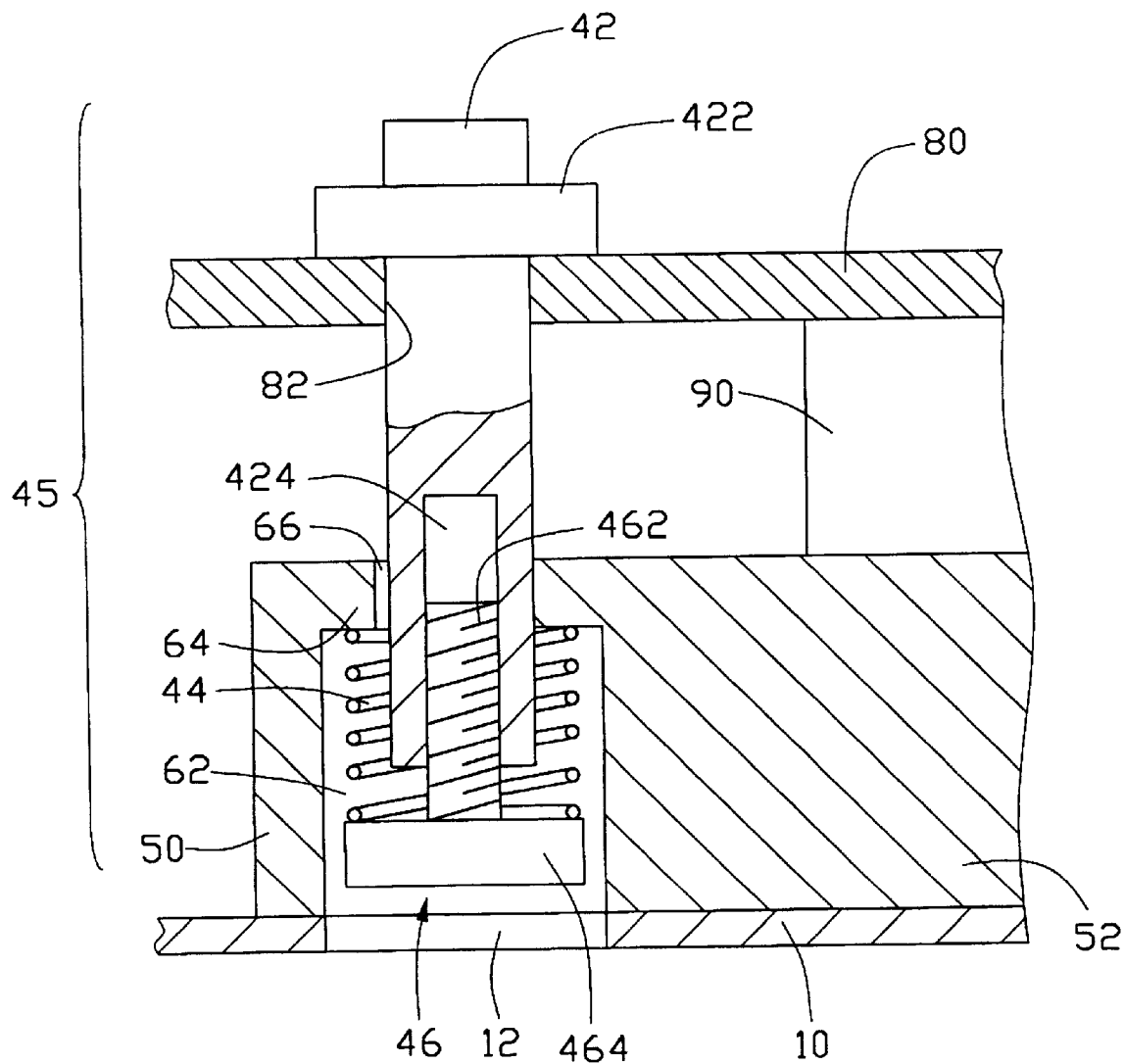
FIG. 2 is a cross-sectional view taken along part of the line II-II of FIG. 1.
Figure 3:
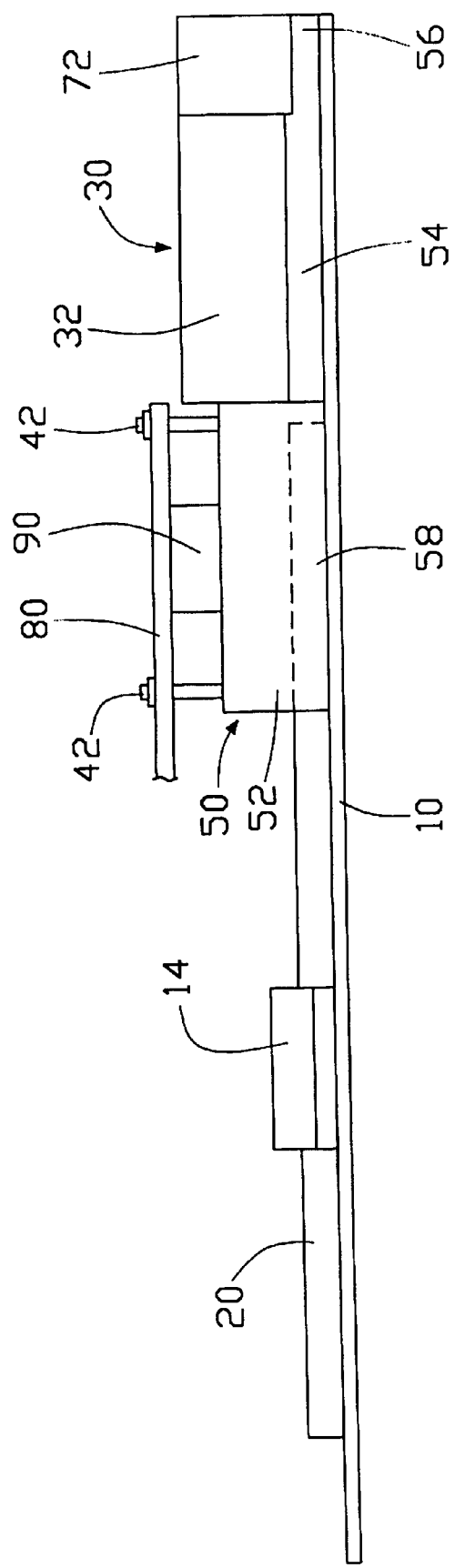
FIG. 3 is a side elevational view of FIG. 1.

Referring to FIGS. 1–3, a heat dissipating device (not labeled) of the present invention which dissipates heat from an electronic device 90 mounted on a printed circuit board 80 comprises a heat sink 50 and a plurality of adjusters 45. The heat dissipating device cooperates with a fan 30, a heat pipe 20, and a radiating plate 10.

The radiating plate 10 is constructed from a metal sheet, and has a plurality of first through holes 12 defined therethrough. A locating portion 14 is attached on an upper surface of the radiating plate 10. The locating portion 14 has a through hole (not labeled) defined therethrough, for the extension of the heat pipe 20 therethrough.

The heat sink 50 is mounted on the upper surface of the radiating plate 10 by conventional means, and is generally opposite to the locating portion 14. The heat sink 50 consists of a first portion 52, a second portion 54 and a third portion 56. Each first, second and third portion 52, 54, 56 has a different thickness.

The first portion 52 defines a plurality of receiving holes 62 in a bottom surface thereof, in alignment with corresponding first through holes 12 of the radiating plate 10. A plurality of second through holes 66 is defined in a top surface of the first portion 52, in axial alignment with and communicating with corresponding receiving holes 62. The diameter of each second through hole 66 is smaller than that of each receiving hole 62, thereby forming a shoulder 64. A groove 58 is defined in the bottom surface of the first portion 52, for receiving the heat pipe 20. The printed circuit board 80 with the electronic device 90 mounted thereon is located above the first portion 52 of the heat sink 50, with the electronic device 90 abutting the top surface of the first portion 52. A plurality of holes 68 is defined in the top surface of the first portion 52 of the heat sink 50, in the surrounding vicinity of the electronic device 90. These improve the efficiency of heat dissipation. The printed circuit board 80 defines a plurality of retaining holes 82 in axial alignment with corresponding second through holes 66 of the heat sink 50.

A fan 30 is fixed on the second portion 54 of the heat sink 50. The fan 30 has a base 32. A circular intake vent 34 is defined in a top surface of the base 32, and exhaust vents (not labeled) are defined in side surfaces of the base 32. A plurality of leaves 36 is fixed in the base 32 below the intake vent 34. A plurality of fins 72 extends upwardly from the third portion 56 of the heat sink 50 adjacent the fan 30, for enhancing heat transfer.

The heat pipe 20 is filled with fluid for cooling. One end of the heat pipe 20 extends through the locating portion 14 of the radiating plate 10, thereby securing the heat pipe 20 onto the radiating plate 10. The other end of the heat pipe 20 is received in the groove 58 of the heat sink 50, for removing heat from the heat sink 50.

A preferred embodiment of an adjuster 45 of the present invention for adjusting distance and contact force between the heat dissipating device and the electronic device 90 comprises a connecting shaft 42, a spring 44 and a lock screw 46. One end of the connecting shaft 42 extends through the retaining hole 82 of the printed circuit board 80. A flange 422 near a top end of the connecting shaft 42 abuts the printed circuit board 80, for securing the connecting shaft 42 to the printed circuit board 80. The connecting shaft 42 is dimensioned to extend through the second through hole 66 and into the receiving hole 62 of the heat sink 50. The bottom surface of the connecting shaft 42 defines a screw hole 424. The lock screw 46 has a head 464 and a screw bolt 462, for threadedly engaging with the screw hole 424 of the connecting shaft 42.

In assembly of each adjuster 45, the spring 44 is secured between the head 464 of the lock screw 46 and the shoulder 64 of the heat sink 50. When adjusting the lock screw 46 in the connecting shaft 42, the elastic force of the spring 44 operates to adjust the tightness between the heat sink 50 and the electronic device 90. Thus the heat sink 50 and the electronic device 90 can be firmly held together while minimizing the risk of damage which may be caused by overtightness. The elastic deformation of the spring 44 also absorbs force generated during installation, thereby protecting the electronic device 90 from damage.

Figure 4:
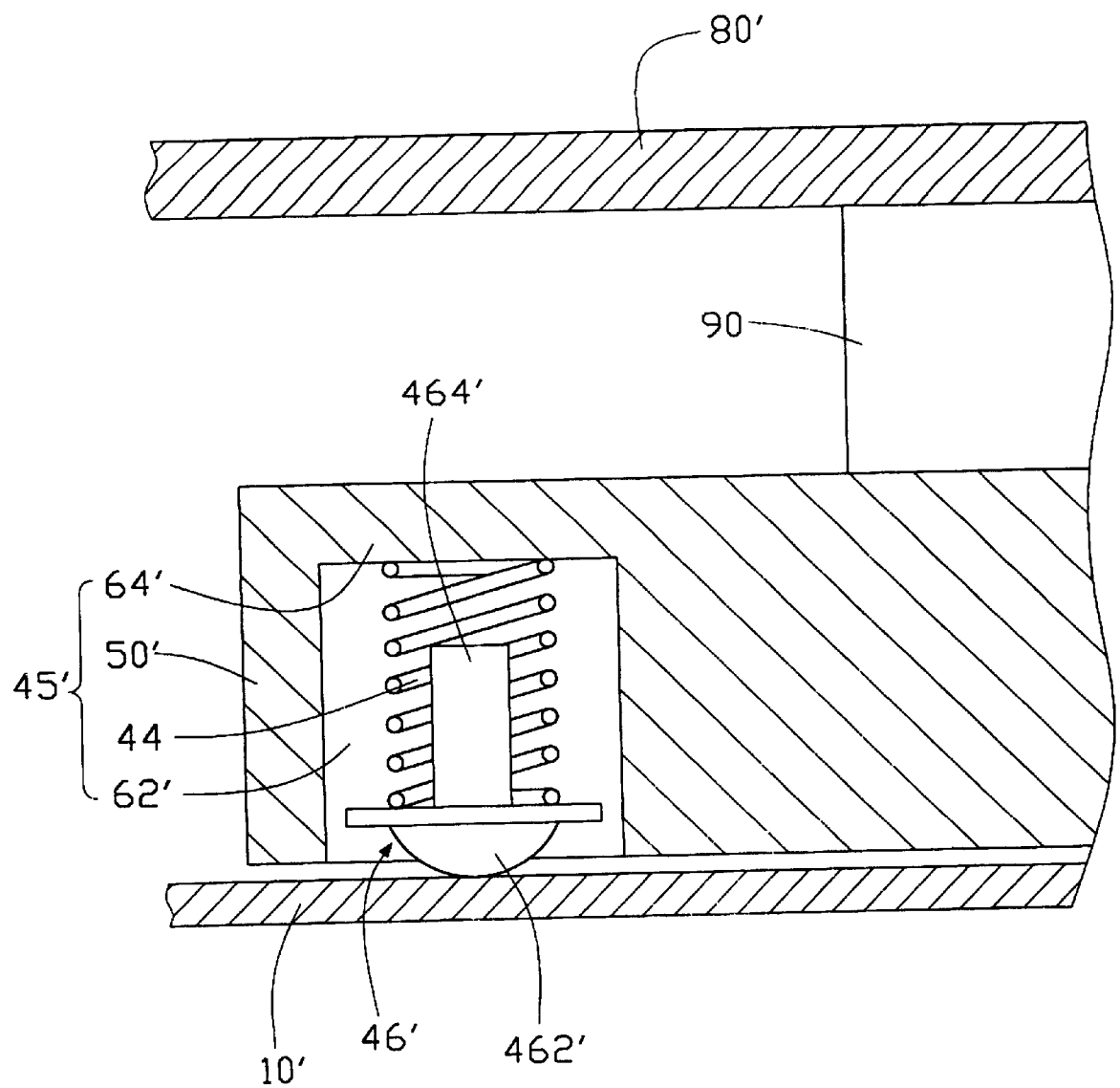
FIG. 4 is similar to FIG. 2, but shows a heat dissipating device in accordance with an alternative embodiment of the present invention.

Also referring to FIG. 4, a heat dissipating device (not labeled) in accordance with an alternative embodiment of the present invention comprises a heat sink 50' and at least one adjuster 45'. The heat dissipating device cooperates with a fan (not shown), a heat pipe (not shown), and a radiating plate 10'. The heat sink 50' is constrained in position relative to the radiating plate 10' in directions parallel to the planar surface of the radiating plate 10', using conventional means. The heat sink 50' is moveable relative to the radiating plate 10' along a direction perpendicular to the planar surface of the radiating plate 10'. In this alternative embodiment, it is assumed that the position of the radiating plate 10' is fixed. For example, the radiating plate 10' may be attached to the enclosure of a computer.

A receiving hole 62' is defined in a bottom surface of the heat sink 50', for receiving the adjuster. A shoulder 64' of an upper portion of the heat sink 50' defines an upper limit of the receiving hole 62'. Each adjuster 45' comprises a spring 44 and a pin 46'. The pin 46' has a cap 462' and a bolt 464'. The pin 46' is located in the receiving hole 62' with the cap 462' in engagement with the radiating plate 10'. The spring 44 is located between the cap 462' and the shoulder 64'. The elastic force of the spring 44 operates to provide a force between the heat sink 50' and the electronic device 90. Thus the heat sink 50' and the electronic device 90 are firmly held together while minimizing the risk of damage which may be caused by overtightness. The elastic deformation of the spring 44 also absorbs force generated during installation, thereby protecting the electronic device 90 from damage. The elastic force of the spring 44 is adjusted by replacing it with another spring 44 which has a different height or a different elastic coefficient.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat dissipating device comprising:
    a heat sink adapted to remove heat from an electronic device mounted on a printed circuit board, the heat sink defining at least a receiving hole and comprising a first portion adapted to be in thermal contact with the electronic device, a second portion adapted to attach a fan thereto, and a third portion with a plurality of fins attached thereto, wherein the heat sink is adapted to receive at least a heat pipe therein; and
    at least an adjuster having at least a spring compressingly received in the at least a receiving hole of the heat sink and having an adjusting member for compressing the spring to act against the heat sink, thereby adjusting distance and force between the electronic device and the heat sink.

2. The heat dissipating device as claimed in claim 1, wherein the heat sink defines at least a through hole in communication with the at least a receiving hole, the through hole having a diameter smaller than that of the receiving hole, thereby forming at least a shoulder in the heat sink adjacent the at least a through hole and the at least a receiving hole.

3. The heat dissipating device as claimed in claim 1, wherein each adjuster has a connecting shaft having a frist end extending through the through hole and into the receiving hole to connect to the adjusting member, and wherein each spring is located between the shoulder of the heat sink and the adjusting member.

4. The heat dissipating device as claimed in claim 2, wherein each connecting shaft has a screw hole, and the adjusting member comprises a lock screw threadedly engaging with the screw hole.

5. The heat dissipating device as claimed in claim 3, wherein each connecting shaft has a second end fixed in the printed circuit board.

6. The heat dissipating device as claimed in claim 1, wherein the at least a spring can be replaced with another spring having a different height and/or elastic coefficient, thereby adjusting distance and contact force between the electronic device and the heat sink.

7. An electronic device assembly comprising:
    a printed circuit board;
    an electronic device mounted on the printed circuit board;
    a heat sink associated with the electronic device, the heat sink defining at least a receiving hole and a through hole in communication with the at least a receiving hole;
    at least an adjuster for adjusting distance and force between the electronic device and the heat sink, the adjuster comprising a connecting shaft extending through the at least a through hole and into the at least a receiving hole, a lock screw threadedly engaging with the connecting shaft, and a spring compressingly secured between the heat sink and the lock screw; and
    at least a radiating plate in thermal contact with the heat sink and arranged opposite the printed circuit board.

8. An electrical device assembly comprising:
    a printed circuit board defining a retaining hole;
    an electronic device mounted on the printed circuit board;
    a heat sink abutting against the electronic device opposite to said printed circuit board, said heat sink defining aligned receiving hole and through hole commonly in alignment with the retaining hole;
    a radiating plate in thermal contact with the heat sink and arranged opposite the printed circuit board; and
    an adjuster including a lock screw with a coaxial spring commonly embedded in the receiving hole and compressed by said lock screw, said lock screw abutting the radiating plate.

* * * * *